United States Patent
Abe

(10) Patent No.: US 11,184,988 B2
(45) Date of Patent: Nov. 23, 2021

(54) PEDESTAL MOUNTED WITH A BLANK, CRYSTAL UNIT, AND OSCILLATOR

(71) Applicant: NIHON DEMPA KOGYO CO., LTD., Tokyo (JP)

(72) Inventor: Tomonori Abe, Saitama (JP)

(73) Assignee: NIHON DEMPA KOGYO CO., LTD., Tokyo (JP)

(*) Notice: Subject to any disclaimer, the term of this patent is extended or adjusted under 35 U.S.C. 154(b) by 0 days.

(21) Appl. No.: 17/030,406

(22) Filed: Sep. 24, 2020

(65) Prior Publication Data
US 2021/0100119 A1 Apr. 1, 2021

(30) Foreign Application Priority Data
Sep. 27, 2019 (JP) .............................. JP2019-176473

(51) Int. Cl.
| | |
|---|---|
| H05K 5/02 | (2006.01) |
| H03B 1/00 | (2006.01) |
| H03H 9/10 | (2006.01) |
| H03H 9/05 | (2006.01) |

(52) U.S. Cl.
CPC ............. *H05K 5/0234* (2013.01); *H03B 1/00* (2013.01); *H03H 9/0509* (2013.01); *H03H 9/0514* (2013.01); *H03H 9/0547* (2013.01); *H03H 9/1021* (2013.01)

(58) Field of Classification Search
CPC .. H03H 9/1021; H03H 9/0509; H03H 9/0547; H03H 9/0514; H05K 5/0234; H03B 1/00
USPC ..................................... 331/158, 68; 310/348
See application file for complete search history.

(56) References Cited

U.S. PATENT DOCUMENTS

| | | | |
|---|---|---|---|
| 7,482,735 B2 * | 1/2009 | Harada | H03H 9/0509 310/348 |
| 7,760,034 B2 * | 7/2010 | Moriya | H03H 9/1021 331/68 |
| 2013/0257549 A1 * | 10/2013 | Asamura | H03H 9/0538 331/68 |

FOREIGN PATENT DOCUMENTS

JP 3017750 3/2000

* cited by examiner

*Primary Examiner* — Arnold M Kinkead
(74) *Attorney, Agent, or Firm* — JCIPRNET

(57) ABSTRACT

A pedestal on which a beveled blank is mounted is provided with a recess portion and an edge portion. The recess portion is provided in a central part of a surface of a pedestal body of the pedestal. The edge portion is adjacent to the recess portion to which the blank is fixed. The recess portion has a length in the short side direction of the pedestal body longer than that of the short side of the blank.

9 Claims, 8 Drawing Sheets

PEDESTAL MOUNTED WITH A BLANK, CRYSTAL UNIT, AND OSCILLATOR

CROSS-REFERENCE TO RELATED APPLICATIONS

This application claims the priority benefit of Japanese Patent Application No. 2019-176473, filed on Sep. 27, 2019. The entirety of the above-mentioned patent application is hereby incorporated by reference herein and made a part of this specification.

TECHNICAL FIELD

The present disclosure relates to a pedestal mounted with a blank (i.e., vibrating element), a crystal unit and an oscillator, and more particularly to a pedestal, a crystal unit and an oscillator capable of improving vibration characteristics when a blank which is beveled (i.e., a beveled blank) is mounted.

DESCRIPTION OF THE RELATED ART

Description of Prior Arts

In the conventional crystal unit, a structure using a pedestal (i.e., crystal pedestal) mainly composed of crystals is known as a structure to suppress the impact on the crystal piece from the package and the outside of the package, so as to improve phase noise characteristics.

Further, there is an oscillator in which a crystal piece and an IC (Integrated Circuit) of an oscillator circuit are mounted in a package having a recess portion.

Further, there is a crystal oscillator having a package with an H-type structure in which recess portions are formed on a front surface and a back surface, and a crystal piece and a crystal pedestal are mounted on the side of the front surface, and an IC of an oscillation circuit is mounted on the side of the back surface.

There is a temperature-compensated crystal oscillator (TCXO: Temperature Compensated Crystal Oscillator) in which a temperature-compensating circuit is provided on the front surface or the back surface of the package.

Beveling Process

Some crystal blanks are beveled, in which the central part is thicker and the peripheral part is thinner, and the outer peripheral part is polished so as to be chamfered, in order to improve the vibration characteristics with the CI (i.e., Crystal Impedance) value as an appropriate value.

A Crystal Unit Provided with a Conventional Pedestal: FIG. 13

A crystal unit provided with a conventional pedestal will be described with reference to FIG. 13. FIG. 13 is a cross-sectional explanatory view of a crystal unit provided with a conventional pedestal.

As shown in FIG. 13, the crystal unit (i.e., conventional crystal unit) provided with a conventional pedestal has a configuration in which a pedestal 32 is mounted in a recess portion of a package 31 made of ceramic or the like, and a blank 33 that is beveled (i.e., crystal blank) is fixed on the pedestal 32 by a conductive adhesive 34.

On the blank 33, the excitation electrodes are formed on the front surface and the back surface, but they are omitted here.

The pedestal 32 is formed in a rectangular shape with crystals or the like, and is connected to the electrode formed on the surface of the recess portion of the package 31 by the solder (or conductive adhesive) 35.

Here, in the conventional crystal unit, if the blank 33 is beveled, the central part of the blank 33 may come into contact with the surface of the pedestal 32, as shown in FIG. 13, depending on the application amount and the application position of the conductive adhesive 34.

Related Art

Incidentally, as the prior art of the crystal unit with a pedestal, there is Japanese Patent No. 3017750, "Crystal Oscillator".

Japanese Patent No. 3017750 discloses a crystal oscillator in which a holding blank having a recess portion is fixed on a base, and a rectangular crystal element is mounted on the recess portion. A first fixing direction connecting the both end portions to be fixed of the holding blank and a second fixing direction connecting the both end portions in a longitudinal direction to be fixed of the crystal element are orthogonal to each other.

However, in a crystal unit using a conventional pedestal, there is a problem that a central part with a convex shape of a beveled blank comes into contact with a pedestal surface depending on an application amount and an application position of a conductive adhesive, and thus, vibration characteristics are deteriorated.

Incidentally, Japanese Patent No. 3017750 does not disclose that a recess portion is provided in the central part of the pedestal so that the central part of the beveled blank does not contact the pedestal.

The disclosure has been made in view of the above-described situation, and provides a pedestal, a crystal unit and an oscillator capable of obtaining good vibration characteristics by preventing a central part of a beveled blank from contacting a surface of the pedestal and not disturbing with the vibration.

SUMMARY

According to an aspect of this disclosure, a pedestal is provided for mounting a blank which is beveled, and the pedestal includes a recess portion and an edge portion. The recess portion is provided in a central part of a surface of a pedestal body of the pedestal. The edge portion is adjacent to the recess portion, and the blank is fixed to the edge portion. And, a length of the recess portion in a short side direction of the pedestal body is longer than a length of a short side of the blank.

BRIEF DESCRIPTION OF THE DRAWINGS

The foregoing and additional features and characteristics of this disclosure will become more apparent from the following detailed description considered with reference to the accompanying drawings, wherein.

DETAILED DESCRIPTION

The following describes an embodiment of the disclosure with reference to the drawings.

Outline of Embodiment

The pedestal (the present pedestal) according to an embodiment of the disclosure is a pedestal on which a blank that is beveled (i.e., a beveled blank) is mounted, and a recess portion is formed in a central part of a surface on which the blank is mounted. At both ends of the recess portion, the edge portion is formed. A length of the recess portion in a short side direction of a pedestal body is longer than a length of a short side direction of the blank to be mounted. By applying a conductive adhesive to the edge portion and mounting the blank, the central part of the blank having a large thickness is located above the recess portion, and the central part of the blank can be prevented from contacting the pedestal surface, and the vibration characteristics can be improved.

In addition, the crystal unit (the present crystal unit) according to an embodiment of the disclosure is a crystal unit in which a beveled blank, to which a conductive adhesive is applied to an outer edge portion of a recess portion of the pedestal, is mounted. The central part of the blank having a large thickness will be located above the recess portion, which prevents the central part of the blank from contacting a surface of the pedestal, and thus, it is possible to improve the characteristics.

Further, the present oscillator is provided with an oscillation circuit in the same package as the present crystal unit.

Configuration of the Pedestal: FIG. 1 to FIG. 4

There are the first to the fourth pedestals of different shapes as this pedestal, and each of them will be explained. Each of the first to the fourth pedestals is made of crystals or the like.

Figure 1A:
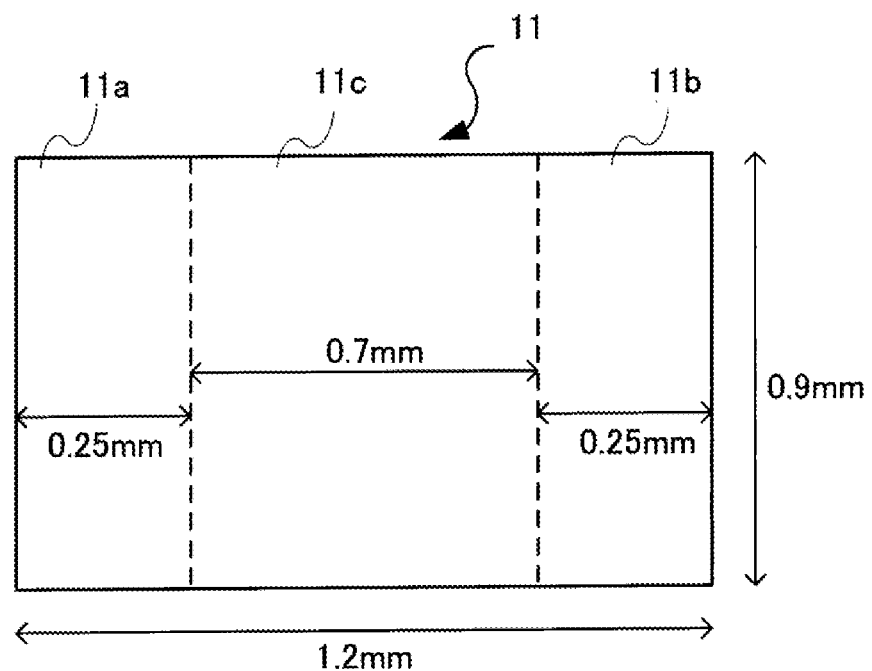
FIG. 1A is an explanatory view showing a configuration of a first pedestal, in which is a top view.
Figure 1B:
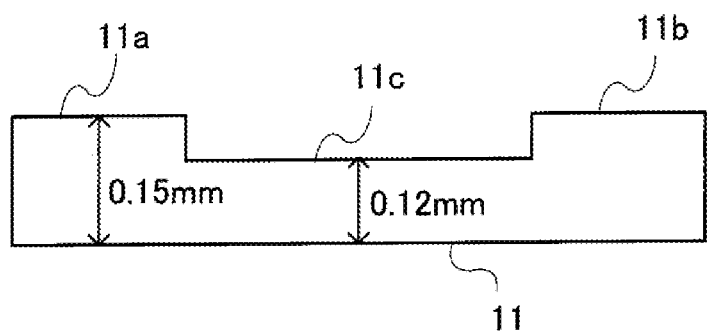
FIG. 1B is an explanatory view showing a configuration of a first pedestal, in which is a side view of a long side.
Figure 2A:
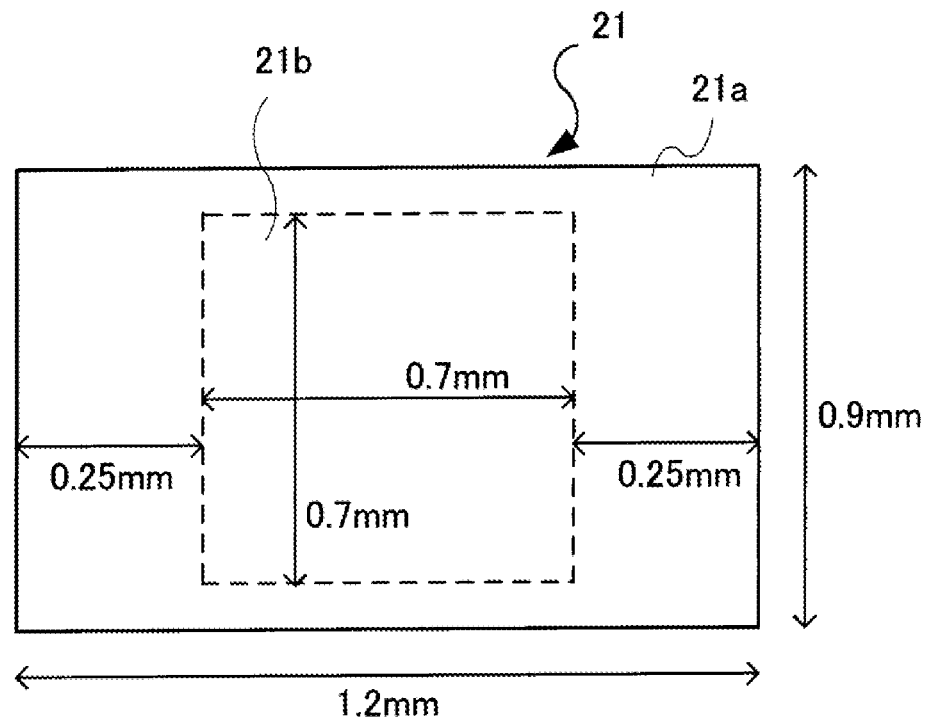
FIG. 2A is an explanatory view showing a configuration of a second pedestal, in which is a top view.
Figure 2B:
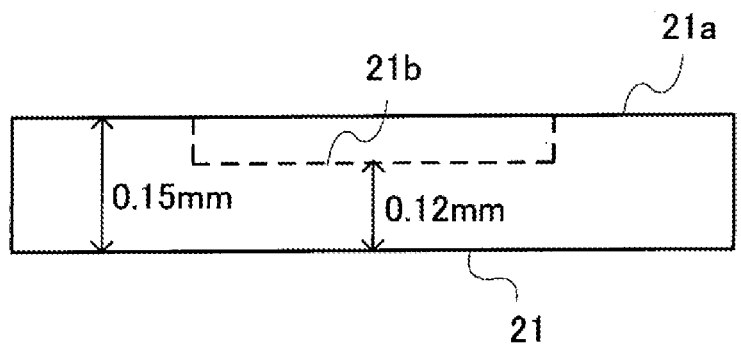
FIG. 2B is an explanatory view showing a configuration of a second pedestal, in which is a side view of a long side.
Figure 3A:
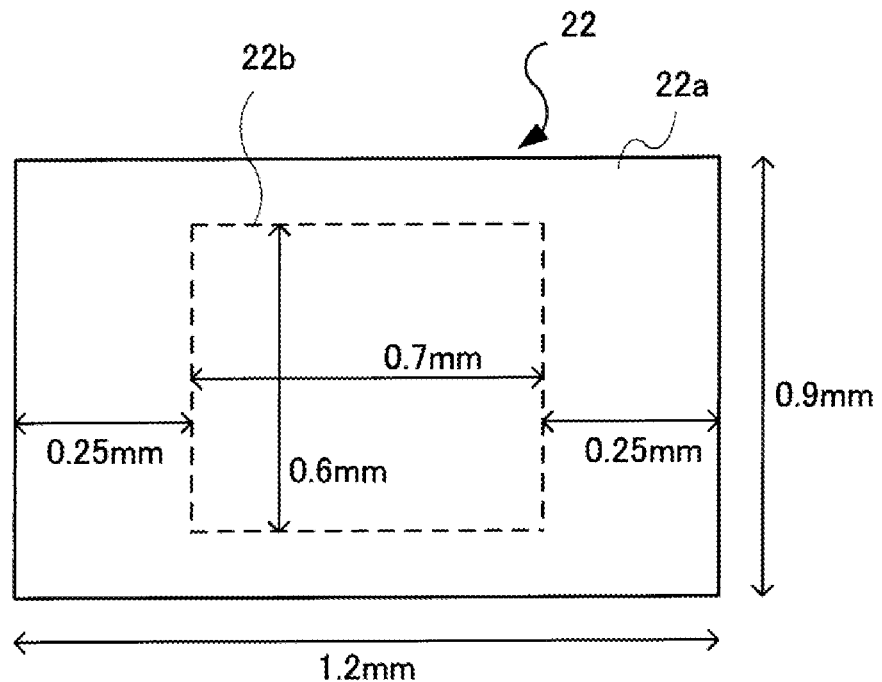
FIG. 3A is an explanatory view showing a configuration of a third pedestal, in which is a top view.
Figure 3B:
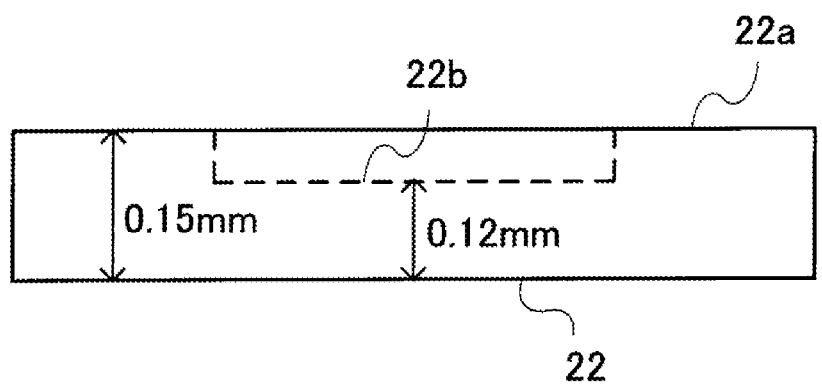
FIG. 3B is an explanatory view showing a configuration of a third pedestal, in which is a side view of a long side.
Figure 4:
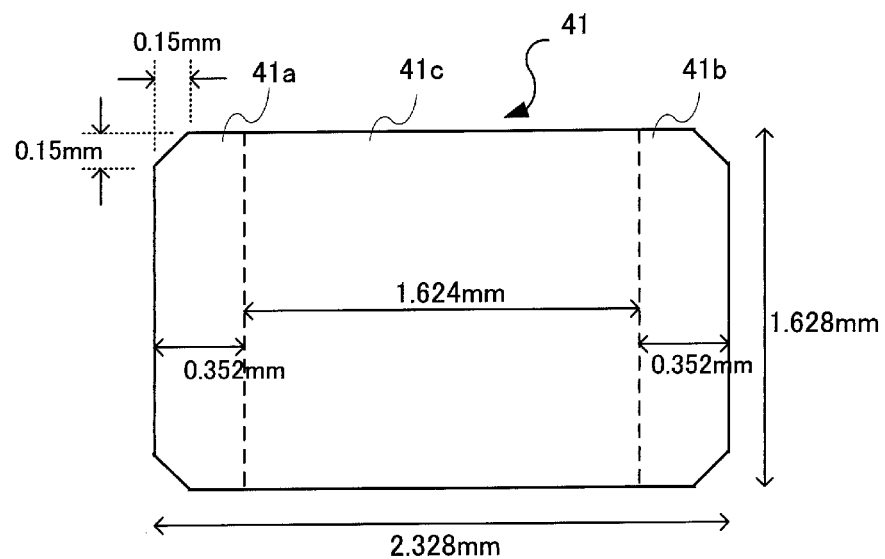
FIG. 4 is a top view showing a configuration of a fourth pedestal.

FIG. 1A and FIG. 1B are explanatory views showing a configuration of the first pedestal, in which FIG. 1A is a top view, and FIG. 1B is a side view of a long side. FIG. 2A and FIG. 2B are explanatory views showing the configuration of the second pedestal, in which FIG. 2A is a top view, and FIG. 2B is a side view of a long side. FIG. 3A and FIG. 3B are explanatory views showing the configuration of the third pedestal, in which FIG. 3A is a top view, and FIG. 3B is a side view of a long side. FIG. 4 is a top view showing the configuration of the fourth pedestal.

In the side views of FIG. 1B to FIG. 3B, the difference in the height direction is exaggerated make it easier to understand.

The First Pedestal: FIG. 1A and FIG. 1B

First, the first pedestal will be described with reference to FIG. 1A and FIG. 1B.

The first pedestal 11 is shaped by cutting out a rectangular crystal plate and shaving off the recess portion described below, especially for mounting beveled blanks.

As shown in FIG. 1A, the main body of the first pedestal 11 has a rectangular shape with a length (short side) of 0.9 mm, a width (long side) of 1.2 mm, and a thickness of 0.15 mm. An area of 0.25 mm width from the short side in parallel to the left shorter side, and an area of 0.25 mm width from the right shorter side are the edge portions 11a and 11b respectively, which is defined as an edge. An area sandwiched between the two edge portions 11a and 11b is the recess portion 11c having a thin thickness.

The recess portion 11c is open to the surface side where the blank is mounted.

The edge portions 11a and 11b are areas on the pedestal surface where the recess portion 11c are not formed and are provided adjacent to the recess portion 11c.

The length of the recess portion 11c in the lateral direction (in the long side direction of the main body) is 0.7 mm, and the depth of the recess portion 11c is 0.03 mm.

Here, in the first pedestal 11, as shown in FIG. 1A and FIG. 1B, the recess portion 11c is formed to connect the long sides facing each other from one long side to the other long side. That is, in the first pedestal 11, the bottom surface of the recess portion 11c is exposed on the end surface of the long side of the pedestal body, and the boundary portion between the edge portion 11a and 11b and the recess portion 11c is a step.

When forming the recess portion 11c of the first pedestal 11, a photoresist is used to mask the edge portions 11a and 11b from the flat surface of the main body of the pedestal, and then, the recess portion 11c is formed by scraping off by wet etching.

The shape of the first pedestal 11 is easy to form since the process margin in wet etching is wide and strict accuracy is not required.

Incidentally, according to the second pedestal to the fourth pedestal to be described later, the recess portion is formed by wet etching.

Then, both ends of the beveled blank are mounted on the edge portions 11a and 11b by applying a conductive adhesive.

As a result, the central part of the blank is located above the recess portion 11c of the first pedestal 11, and even if the central part is thicker than the peripheral part due to a beveling process, the central part of the blank does not contact the surface of the recess portion 11c of the first pedestal 11.

The mounting of the blank will be described later.

The Second Pedestal: FIG. 2A and FIG. 2B

Next, the configuration of the second pedestal will be described with reference to FIG. 2A and FIG. 2B.

As shown in FIG. 2A, the second pedestal 21 has the same main body shape as the first pedestal 11, that is, 0.9 mm in a length (short side), 1.2 mm in a width (long side), and 0.15 mm in a thickness. However, the second pedestal 21 differs in that, the recess portion 21b is not exposed on end edges of the pedestal body and is surrounded on all sides by the edge portion 21a.

Specifically, in the second pedestal 21, a recess portion 21b with a rectangular shape is formed in the central part, and an edge portion 21a is formed around the outside of the recess portion 21b. The thickness of the edge portion 21a is 0.15 mm.

The opening of the recess portion 21b is a square having a length of 0.7 mm and a width of 0.7 mm, and the depth of the recess portion 21b is 0.03 mm.

The edge portion 21a surrounding the outside of the recess portion 21b is formed in a frame shape having a width of 0.25 mm on the short side and a width of 0.10 mm on the long side.

Here, as a feature of the pedestal (the first to the fourth pedestals), the length of the recess portion relative to the short side direction of the pedestal body is formed larger than the width of the blank to be mounted (the length of the blank in the short side direction).

Thus, it is possible to prevent the peripheral part of the blank from contacting the pedestal due to displacement or vibration at the time of mounting, thereby obtaining good vibration characteristics.

The Third Pedestal: FIG. 3A and FIG. 3B

Next, the configuration of the third pedestal will be described with reference to FIG. 3A and FIG. 3B.

As shown in FIG. 3A, the third pedestal 22 has the same main body shape as the first pedestal 11 and the second pedestal 21, that is, 0.9 mm in a length (short side), 1.2 mm in a width (long side), and 0.15 mm in a thickness. It is similar to the second pedestal 21 in that, the third pedestal 22 has a recess portion 22b in the central part of the pedestal body.

However, the dimensions of the recess portion 22b is different from the dimensions of the recess portion 21b of the second pedestal 21, that is, the length of the longitudinal direction (short side direction of the pedestal body) of the recess portion 22b is 0.6 mm, which is narrower than that of the recess portion 21b of the second pedestal 21, and has an elongated shape. The length of the recess portion 22b in the lateral direction (in the long side direction of the pedestal body) is 0.7 mm, which is as same as that of the recess portion 21b in the second pedestal 21.

Accordingly, the dimension of the edge portion 22a has a frame shape in which the width on the short side is 0.25 mm and the width on the long side is 0.15 mm.

The third pedestal 22 has a shape suitable for mounting a blank having an elongated shape as compared with the first pedestal 11 and the second pedestal 21. The blanks mounted on the third pedestal 22 are narrower than the blanks mounted on the first pedestal 11 and the second pedestal 21, since the length of the short side of the blank mounted on the third pedestal 22 is smaller than the length of the short side of the recess portion 22b.

The Fourth Pedestal: FIG. 4

Next, the fourth pedestal will be described with reference to FIG. 4.

The fourth pedestal 41 is formed to have a larger outer dimension than the first pedestal 11 to the third pedestal 22 as described above.

Specifically, as shown in FIG. 4, the fourth pedestal 41 has a substantially rectangular shape with a length (short side) of 1.628 mm, a width (long side) of 2.328 mm, and a thickness of 0.120 mm.

Four angled portions of the fourth pedestal 41 are chamfered, and at the angled portions, portions of 0.150 mm in length and width are obliquely cut out.

Then, the fourth pedestal 41, similarly to the first pedestal 11, has the recess portion 41c formed in the central part from one long side of the pedestal body to the other long side thereof, and the edge portion 41a is disposed at the left short side of the recess portion 41c, and the edge portion 41b is disposed at the right short side of the recess portion 41c.

The recess portion 41c of the fourth pedestal 41 has a length of 1.624 mm in the long side direction and a depth of 0.035 mm, and the widths of the edge portions 41a and 41b are 0.352 mm.

That is, the fourth pedestal 41 has a shape larger and thinner than the first pedestal 11 to the third pedestal 22, and mounts a blank larger than the blank mounted on the first pedestal 11 to the third pedestal 22.

Figure 5:
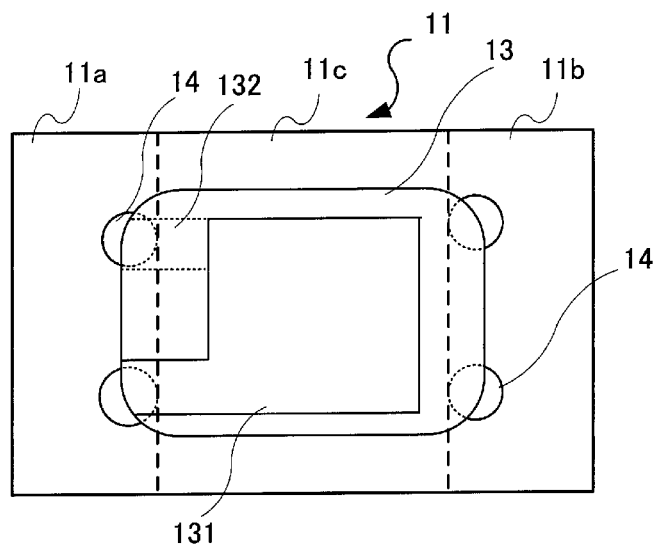
FIG. 5 is a top view of the first crystal unit.

The Crystal Unit Equipped With a Blank on the First Pedestal: FIG. 5

Next, a crystal unit (the first crystal unit) in which a blank is mounted on the first pedestal 11 will be described with reference to FIG. 5. FIG. 5 is a top view of the first crystal unit.

A blank 13 is a crystal piece that is beveled, as shown in FIG. 5, on which an excitation electrode 131 on the front surface side and an excitation electrode 132 on the back surface side are formed. The short side of the blank 13 on the side from which the excitation electrodes 131 and 132 are drawn out is fixed on an electrode formed on the edge portion 11a of the first pedestal 11 by a conductive adhesive 14.

Electrodes and wiring formed on the edge portion 11a are not shown here. The electrode and the wiring connect the excitation electrodes 131 and 132 of the blank 13 and the electrode formed on the bottom surface of the pedestal.

The short side of the blank 13 on the side from which the excitation electrodes 131 and 132 are not drawn out is also fixed on the edge portion 11b of the first pedestal 11 by the conductive adhesive 14.

As shown in FIG. 5, the central part of the blank 13 is located above the recess portion 11c of the first pedestal 11.

Thus, the thickness of the central part of the beveled blank 13 can be absorbed at the depth of the recess portion 11c, preventing the thick central part from contacting the surface of the first pedestal 11, and does not disturb vibration.

Figure 6:
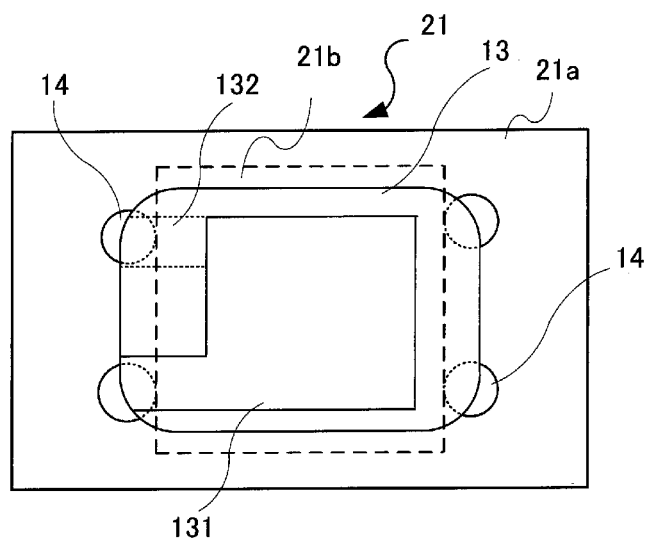
FIG. 6 is a top view of the second crystal unit.

The Crystal Unit With a Blank on the Second Pedestal: FIG. 6

Next, a crystal unit (the second crystal unit) in which a blank is mounted on the second pedestal 21 will be described with reference to FIG. 6. FIG. 6 is a top view of the second crystal unit.

As shown in FIG. 6, the second crystal unit is mounted with the same blank 13 as that of the first crystal unit shown in FIG. 5.

Specifically, the short sides of the blank 13 on the side from which the excitation electrodes 131 and 132 are drawn out are fixed to the electrodes and wirings provided on the edge portion 21a of the second pedestal 21 by the conductive adhesive 14.

The blank 13 is mounted so as to substantially cover the opening of the recess portion 21b of the second pedestal 21, and the short side on the opposite side is also fixed to the edge portion 21a of the second pedestal 21 by the conductive adhesive 14.

Even in the second crystal unit, since the central part of the blank 13 is located at the upper portion of the recess portion 21b, the central part of the blank 13 does not contact the pedestal surface.

Figure 7:
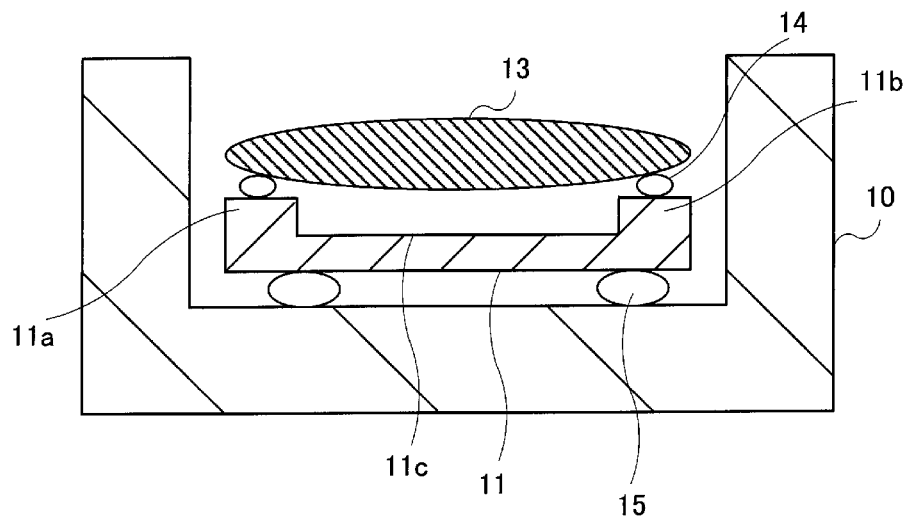
FIG. 7 is a cross-sectional explanatory view of the first crystal unit.

The Configuration of the Cross-Section of the First Crystal Unit: FIG. 7

The configuration of the cross section of the first crystal unit will be described with reference to FIG. 7. FIG. 7 is a cross-sectional explanatory view of the first crystal unit.

As shown in FIG. 7, the first crystal unit has a configuration in which a first pedestal 11 mounted with a beveled blank 13 is fixed to a recess portion of a package 10 made of a ceramic or the like similar to the conventional one by solder (or conductive adhesive) 15.

As shown in FIG. 7, the blank 13 is fixed on the edge portions 11a, and 11b of the first pedestal 11 by a conductive adhesive 14.

As described above, the central part of the blank 13 is mounted above the recess portion 11c of the first pedestal 11. Even if the central part of the blank 13 is convex downward, the depth of the recess portion 11c can absorb it and hold the central part of the blank 13 from contacting the bottom of the recess portion 11c.

Although the first crystal unit using the first pedestal 11 has been described here, the second to fourth crystal unit using the second to fourth pedestals have the same configuration.

Figure 8:
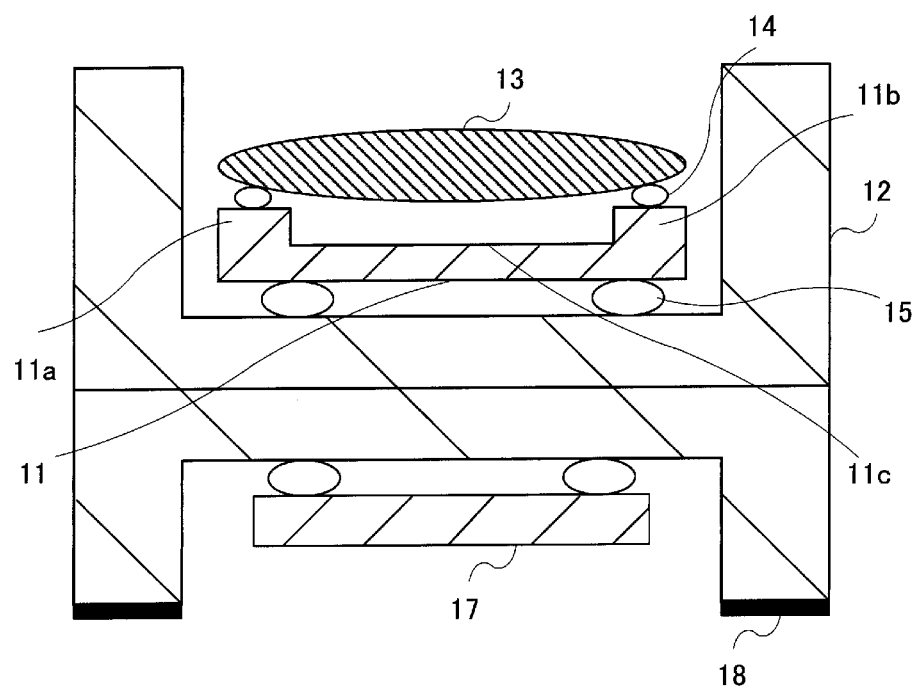
FIG. 8 is a cross-sectional explanatory view of the first oscillator.

The Configuration of the Oscillator Using the First Pedestal: FIG. 8

Next, a configuration of an oscillator using the first pedestal will be described with reference to FIG. 8. FIG. 8 is a cross-sectional explanatory view of the first oscillator.

As shown in FIG. 8, the first oscillator is an H-shaped package 12 with recess portions on the top and bottom surfaces, in which a first pedestal 11 and a beveled blank 13, similar to the first crystal unit described above, are mounted in the recess portion on the top surface, and an oscillation circuit 17 is mounted in the recess portion on the back surface.

Electrodes and wiring are formed on a recess portion surface of the top surface and a recess portion surface of the bottom surface of the package 12. The electrode of the top surface recess portion and the electrode of the bottom surface recess portion are connected by a through hole or the like formed in the package 12.

Then, the excitation electrode 131 and 132 of the blank 13, the oscillation circuit 17, and an external terminal 18 provided on the back surface of the package 12 are electrically connected.

Even in the first oscillator, since the blank 13 does not come into contact with the first pedestal 11, good characteristics can be obtained without disturbing vibration.

Further, instead of the H-type package, it may be configured to mount the first pedestal and the oscillation circuit mounted side by side with the blank 13 in the package having only one recess portion.

The second to the fourth oscillators using the second to the fourth pedestals are similarly constructed.

Figure 9:
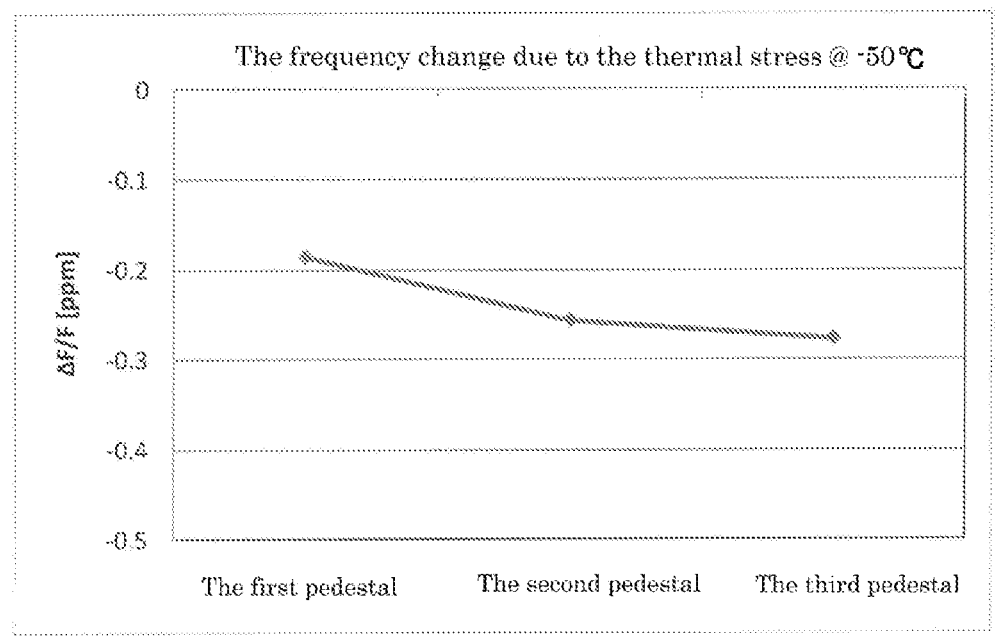
FIG. 9 is an explanatory diagram showing the frequency change due to the thermal stress of the first pedestal to the third pedestal.

The Frequency Change Due to the Thermal Stress (the First to the Third Pedestal): FIG. 9

The frequency change due to the thermal stress is calculated by simulation for a configuration in which a crystal unit with the pedestal (the first to the third pedestal) is mounted on a ceramic or other substrate. The results are shown in FIG. 9. FIG. 9 is an explanatory diagram illustrating the frequency change due to the thermal stress of the first to the third pedestals.

As shown in FIG. 9, the frequency change at −50° C. was calculated for the crystal units with blanks on the first to third pedestals, based on 25° C.

As shown in FIG. 9, the frequency change due to the thermal stress (ΔF/F) is as follows:

the first pedestal<the second pedestal<the third pedestal.

That is, it is understood that the first pedestal is the best in the characteristics of the frequency change due to the thermal stress.

Figure 10:
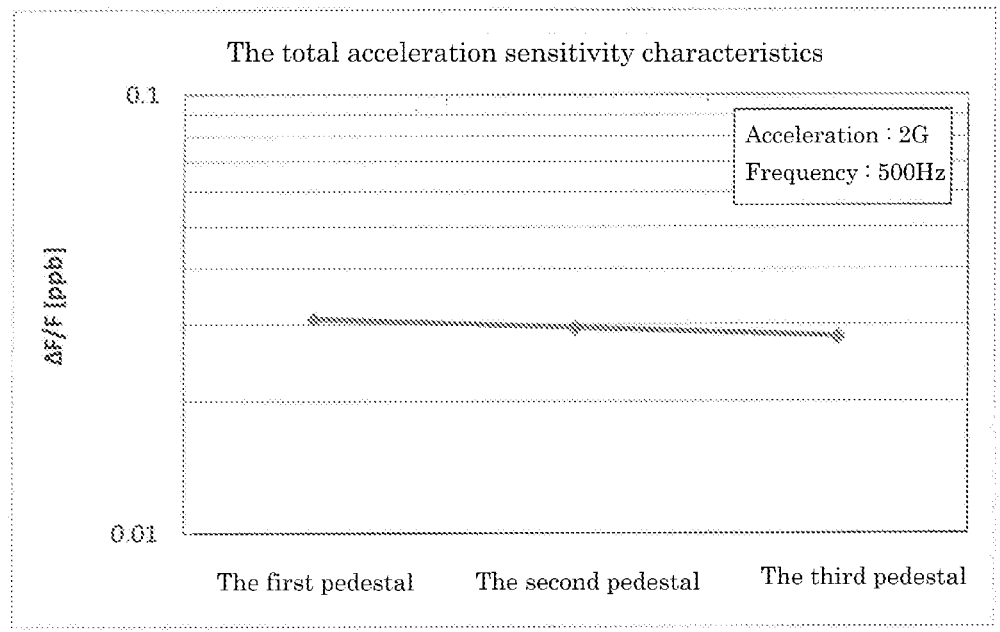
FIG. 10 is an explanatory diagram showing the acceleration sensitivity characteristics of the first pedestal to the third pedestal.

The Acceleration Sensitivity Characteristics (the First to the Third Pedestal): FIG. 10

Next, the acceleration sensitivity characteristics were simulated for the same samples as the thermal stress. FIG. 10 is an explanatory diagram showing the acceleration sensitivity characteristics of the first to the third pedestals.

The output frequency was set to 500 Hz, and the frequency change was calculated by adding 2 G of acceleration to the sample in each of the X, Y and Z directions, and the total of the three directions was calculated as the total acceleration sensitivity.

As shown in FIG. 10, the total acceleration sensitivity is as follows:

the first pedestal>the second pedestal>the third pedestal.

And, it is understood that the third pedestal has the smallest effect of acceleration and is excellent.

Considering both the amount of frequency change due to the thermal stress and the acceleration-sensitivity characteristics, overall, the second pedestal seems to have the best vibration characteristics.

Figure 11:
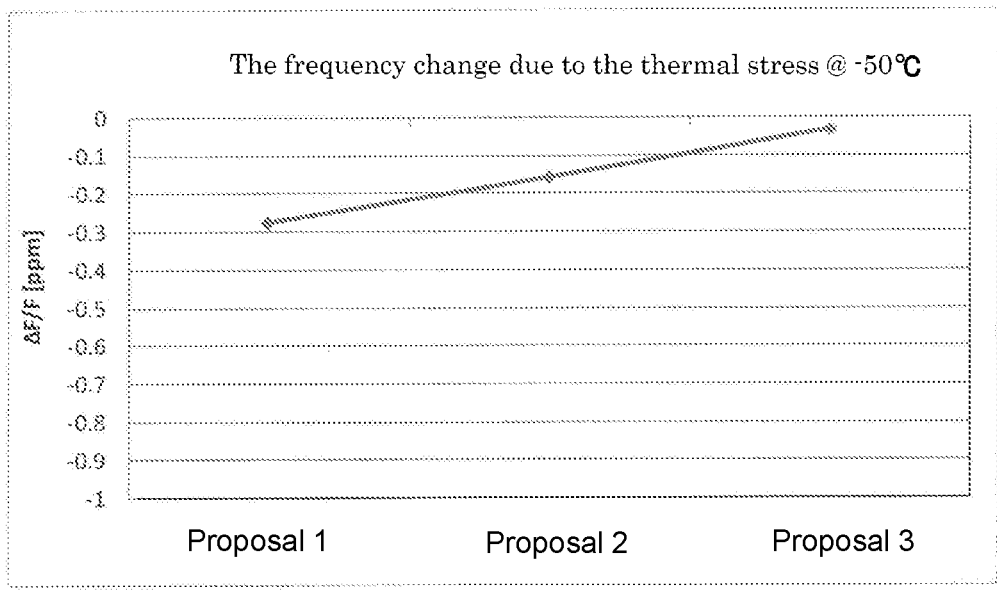
FIG. 11 is an explanatory diagram showing a frequency change due to the thermal stress of the fourth pedestal.

The Frequency Change Due to the Thermal Stress (the Fourth Pedestal): FIG. 11

Next, in the fourth pedestal, the frequency change due to the thermal stress was calculated by simulations for samples with different depths of the recess portion.

The samples were classified into three types, namely, "Proposal 1", "Proposal 2", and "Proposal 3", and evaluation was performed by changing the depth of the recess portion 41c in the same surface shape as the fourth pedestal shown in FIG. 4.

"Proposal 1" has the configuration described with reference to FIG. 4, and the depth of the recess portion 41c is 0.035 mm. In addition, the depth of the "Proposal 2" was 0.050 mm, and the depth of the "Proposal 3" was 0.065 mm.

FIG. 11 shows the simulation results. FIG. 11 is an explanatory diagram showing the frequency change due to the thermal stress of the fourth pedestal. For the crystal units with blanks on the fourth pedestal ("Proposal 1" to "Proposal 3") as well as the first and the third pedestals, the frequency change at −50° C. was calculated based on 25° C.

As shown in FIG. 11, the frequency change (ΔF/F) due to the thermal stress is as follows:

Proposal 1>Proposal 2>Proposal 3.

That is, in the fourth pedestal, the deeper the depth of the recess portion 41c, the smaller the frequency change due to thermal stress, and the better characteristics can be obtained.

Figure 12:
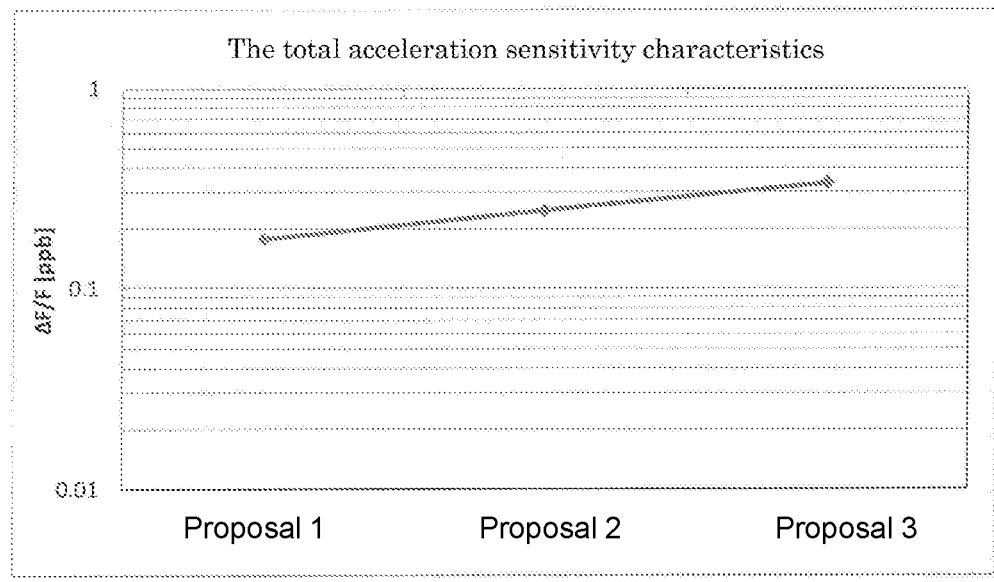
FIG. 12 is an explanatory diagram showing the acceleration sensitivity characteristic of the fourth pedestal.
Figure 13:
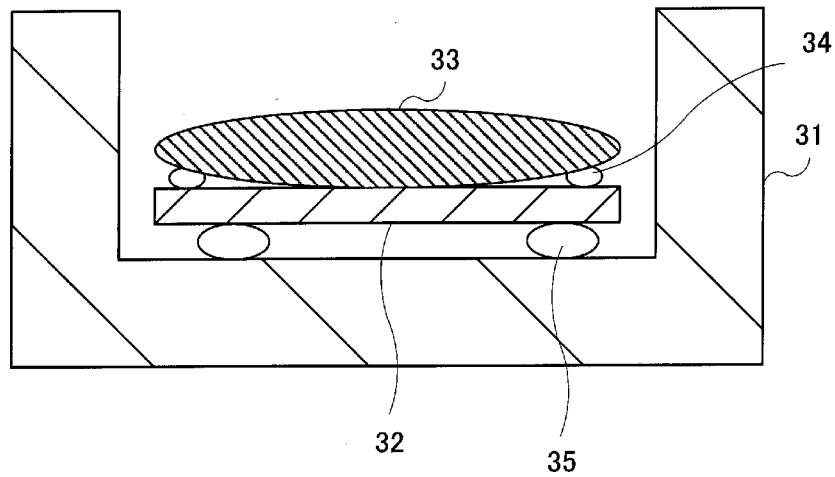
FIG. 13 is a cross-sectional explanatory view of a crystal unit with a conventional pedestal.

The Acceleration Sensitivity Characteristics (the Fourth Pedestal): FIG. 12

Next, the acceleration-sensitivity properties were simulated for the same samples as those of thermal stress. FIG. 12 is an explanatory diagram showing the acceleration sensitivity characteristics of the fourth pedestal.

As with the first to three pedestals, the output frequency was set to 500 Hz, and the change in frequency was calculated by adding 2 G of acceleration to the sample for each of the X, Y, and Z directions, and the total of the three directions was calculated as the overall acceleration sensitivity.

As shown in FIG. 12, the total acceleration sensitivity is as follows:

Proposal 1<Proposal 2<Proposal 3

And, the pedestal of "Proposal 1" has the smallest effect of acceleration and is better.

Considering the frequency change due to the thermal stress and the acceleration sensitivity characteristics together, in the fourth pedestal, "Proposal 2", seems to have the best vibration characteristics.

Effects of Embodiments

According to the first pedestal 11, a pedestal for mounting a beveled blank 13, in which a recess portion 11c is formed in a central part of the surface on which the blank 13 is mounted. Since both ends of the recess portion 11c are configured with edge portions 11a and 11b formed as an edge, if the blank 13 is mounted by applying a conductive adhesive 14 to the edge portions 11a and 11b, the central part of the blank 13, which has a large thickness, will be located above the recess portion 11c. Even if the central part of the blank 13 protrudes downward, it will fit within the space of the recess portion 11c and prevents the central part from contacting the surface of the pedestal, which has the effect of not disturbing with the vibration of the blank and improving the vibration characteristics.

In addition, the use of a pedestal is effective in improving resistance to thermal stress and accelerations.

Furthermore, the second to the fourth pedestals have the same effect.

Further, according to the first to fourth pedestals, the length of the recess portion of the pedestal body with respect to the short side direction of the pedestal body is longer than the length of the short side direction of the blank 13 to be mounted. Therefore, the effect is to prevent the blank 13 from coming into contact with the surface of the pedestal, even if there is some displacement when the blank 13 is mounted.

Furthermore, the first pedestal and the fourth pedestal have a configuration in which a recess portion is formed from one long side end face to the other long side end face, so that the recess portions connect the long sides of the pedestal body. This has the effect of not requiring strict accuracy in the etching process during the manufacture of the pedestal, and thus the manufacture is relatively easy.

Further, according to the present crystal unit, on the surface where the recess portion 11c of the present pedestal is open, the crystal unit on which a beveled blank 13 is mounted by applying a conductive adhesive 14 to the edge portions 11a and 11b at both ends of the recess portion 11c. Therefore, the central part of the blank with a large thickness is located above the recess portion 11c, which has the effect of preventing the central part of the blank 13 from coming into contact with the surface of the pedestal, thereby improving the vibration characteristics.

In addition, this oscillator is provided with an oscillation circuit in the same package as the present crystal unit, and has the same effect.

The disclosure is suitable for pedestals, crystal units and oscillators which prevent the central part of the beveled blank from coming into contact with the surface of the pedestal and which can obtain good vibration characteristics.

Also, according to the disclosure, in the above pedestal, a surface shape of the pedestal body is a rectangle with a short side of 0.9 mm and a long side of 1.2 mm, and the pedestal body has a thickness of 0.15 mm. The recess portion is provided from one long side to the other long side of the pedestal body, a surface shape of the recess portion is a rectangle with the surface shape of 0.9 mm×0.7 mm, and the recess portion has a depth of 0.03 mm, and the edge portion is disposed between the recess portion and the short side of the pedestal body.

Further, according to the disclosure, in the above pedestal, a surface shape of the pedestal body is a rectangle with a short side of 0.9 mm and a long side of 1.2 mm, and the pedestal body has a thickness of 0.15 mm. The recess portion is provided away from the long side and the short side of the pedestal body, and a surface shape of the recess portion is a square with the surface shape of 0.7 mm×0.7 mm, and the recess portion has a depth of 0.03 mm. And, the edge portion is disposed between the recess portion and the long side and the short side of the pedestal body, so as to surround an outside of the recess portion.

Further, according to the disclosure, in the above pedestal, a surface shape of the pedestal body is a rectangle with a short side of 0.9 mm and a long side of 1.2 mm, and the pedestal body has a thickness of 0.15 mm. The recess portion is provided away from the long side and the short side of the pedestal body, and a surface shape of the recess portion is a rectangle with the surface shape of 0.6 mm×0.7 mm, and the recess portion has a depth of 0.03 mm. The edge portion is disposed between the recess portion and the long side and the short side of the pedestal body, so as to surround an outside of the recess portion.

Further, according to the disclosure, in the above pedestal, a surface shape of the pedestal body is a rectangle with a short side of 1.628 mm and a long side of 2.328 mm, and the pedestal body has a thickness of 0.120 mm. The recess portion is provided from one long side to the other long side of the pedestal body, and a surface shape of the recess portion is a rectangular with the surface shape of 1.628 mm×1.624 mm, and the recess portion has a depth of 0.050 mm, and the edge portion is disposed between the recess portion and the short side of the pedestal body.

Further, the disclosure relates to a crystal unit, including: any one of the above-mentioned pedestals, having a surface on which the recess portion is provided; the blank, being fixed to the edge portion, so that a central part of the blank which is beveled is located above an opening of the recess portion; and a substate of a package on which the pedestal is installed.

The disclosure also relates to an oscillator, including: any one of the above-mentioned pedestals, having a surface on which the recess portion is provided; the blank, being fixed to the edge portion, so that a central part of the blank which is beveled is located above an opening of the recess portion; a front substrate of a package on which the pedestal is installed; and an oscillation circuit, being installed on the front substrate of the package or on a back substrate of the package.

Effect of the Disclosure

According to the disclosure, the pedestal for mounting the blank beveled includes: a recess portion provided in a central part of a surface of the pedestal body; and an edge portion, being adjacent to the recess portion, and the blank is fixed to the edge portion. The recess portion prevents the central part of the blank from contacting the surface of the pedestal, since a length of the recess portion in a short side direction of the pedestal body is longer than a length of a short side of the blank. By mounting the blank having a thicker central part than the peripheral part, so that the central part is located above the recess portion of the pedestal. Furthermore, by making the width of the recess portion wider than the width of the blank, it is possible to prevent the peripheral part of the blank also comes into contact with the pedestal, and does not disturb the vibration to obtain a good vibration characteristics as an effect.

Further, according to the disclosure, the pedestal body has a rectangular shape with a short side of 0.9 mm and a long side of 1.2 mm, and a thickness of 0.15 mm. The recess portion is provided from one long side to the other long side of the pedestal body, and has a rectangular surface shape of 0.9 mm×0.7 mm, and has a depth of 0.03 mm. An edge portion is provided between the recess portion and the short side of the pedestal body. Since the pedestal is as described above, severe accuracy is not required in the etching step of forming the recess, and there is an effect that is easy to manufacture.

Further, in the above-mentioned pedestal, the pedestal body has a rectangular shape with a short side of 0.9 mm and a long side of 1.2 mm, and a thickness of 0.15 mm. The recess portion is provided away from the long side and the short side of the pedestal body, and has a square surface shape of 0.7 mm×0.7 mm and a depth of 0.03 mm. An edge portion which surrounds the outside of the recess portion is provided between the long side and the short side of the recess portion and the pedestal body. Since the pedestal is as described above, it is effective to comprehensively improve the resistance to frequency change and acceleration caused by thermal stress as a recess shape according to the size of the blank.

What is claimed is:

1. A pedestal for mounting a blank which is beveled, and the pedestal is installed on a package, and the pedestal comprising:

a recess portion, being provided in a central part of a surface of a pedestal body of the pedestal; and an edge portion, comprising a first edge portion and a second edge portion, the first edge portion and the second edge portion being adjacent to the recess portion, and the blank is fixed to the first edge portion and the second edge portion, wherein a length of the recess portion in a short side direction of the pedestal body is longer than a length of a short side of the blank, wherein a material of the pedestal is crystal, and a material of the package is ceramic, wherein the first edge portion and the second edge portion of the pedestal providing support for a thinner portion of the beveled blank above the recess portion in the central part.

2. A pedestal for mounting a blank which is beveled, comprising:

a recess portion, being provided in a central part of a surface of a pedestal body of the pedestal; and an edge portion, being adjacent to the recess portion, and the blank is fixed to the edge portion, wherein a length of the recess portion in a short side direction of the pedestal body is longer than a length of a short side of the blank, wherein a surface shape of the pedestal body is a rectangle with a short side of 0.9 mm and a long side of 1.2 mm, and the pedestal body has a thickness of 0.15 mm, the recess portion is provided from one long side to the other long side of the pedestal body, a surface shape of the recess portion is a rectangle with the surface shape of 0.9 mm×0.7 mm, and the recess portion has a depth of 0.03 mm, and the edge portion is disposed between the recess portion and the short side of the pedestal body.

3. A pedestal for mounting a blank which is beveled, comprising:

a recess portion, being provided in a central part of a surface of a pedestal body of the pedestal; and an edge portion, being adjacent to the recess portion, and the blank is fixed to the edge portion, wherein a length of the recess portion in a short side direction of the pedestal body is longer than a length of a short side of the blank, wherein a surface shape of the pedestal body is a rectangle with a short side of 0.9 mm and a long side of 1.2 mm, and the pedestal body has a thickness of 0.15 mm, the recess portion is provided away from the long side and the short side of the pedestal body, and a surface shape of the recess portion is a square with the surface shape of 0.7 mm×0.7 mm, and the recess portion has a depth of 0.03 mm, and the edge portion is disposed between the recess portion and the long side and the short side of the pedestal body, so as to surround an outside of the recess portion.

4. A pedestal for mounting a blank which is beveled, comprising:

a recess portion, being provided in a central part of a surface of a pedestal body of the pedestal; and an edge portion, being adjacent to the recess portion, and the blank is fixed to the edge portion, wherein a length of the recess portion in a short side direction of the pedestal body is longer than a length of a short side of the blank, wherein a surface shape of the pedestal body is a rectangle with a short side of 0.9 mm and a long side of 1.2 mm, and the pedestal body has a thickness of 0.15 mm, the recess portion is provided away from the long side and the short side of the pedestal body, and a surface shape of the recess portion is a rectangle with the surface shape of 0.6 mm×0.7 mm, and the recess portion has a depth of 0.03 mm, and the edge portion is disposed between the recess portion and the long side and the short side of the pedestal body, so as to surround an outside of the recess portion.

5. A pedestal for mounting a blank which is beveled, comprising:

a recess portion, being provided in a central part of a surface of a pedestal body of the pedestal; and an edge portion, being adjacent to the recess portion, and the blank is fixed to the edge portion, wherein a length of the recess portion in a short side direction of the pedestal body is longer than a length of a short side of the blank, wherein a surface shape of the pedestal body is a rectangle with a short side of 1.628 mm and a long side of 2.328 mm, and the pedestal body has a thickness of 0.120 mm, the recess portion is provided from one long side to the other long side of the pedestal body, and a surface shape of the recess portion is a rectangle with the surface shape of 1.628 mm×1.624 mm, and the recess portion has a depth of 0.050 mm, and the edge portion is disposed between the recess portion and the short side of the pedestal body.

6. A crystal unit, comprising:

the pedestal according to claim 1, having a surface on which the recess portion is provided;

the blank, being fixed to the edge portion, so that a central part of the blank which is beveled is located above an opening of the recess portion; and a substrate of the package on which the pedestal is installed, wherein the pedestal is disposed between the package and the blank.

7. A crystal unit, comprising:

the pedestal according to claim 5, having a surface on which the recess portion is provided;

the blank, being fixed to the edge portion, so that a central part of the blank which is beveled is located above an opening of the recess portion; and a substrate of a package on which the pedestal is installed.

8. An oscillator, comprising:

the pedestal according to claim 1, having a surface on which the recess portion is provided;

the blank, being fixed to the edge portion, so that a central part of the blank which is beveled is located above an opening of the recess portion;

a front substrate of the package on which the pedestal is installed; and an oscillation circuit, being installed on the front substrate of the package or on a back substrate of the package, wherein the pedestal is disposed between the package and the blank.

9. An oscillator, comprising:

the pedestal according to claim 5, having a surface on which the recess portion is provided;

the blank, being fixed to the edge portion, so that a central part of the blank which is beveled is located above the opening of the recess portion;

a front substrate of a package on which the pedestal is installed; and an oscillation circuit, being installed on the front substrate of the package or on a back substrate of the package.

* * * * *